US011057119B2

(12) United States Patent
Jing et al.

(10) Patent No.: US 11,057,119 B2
(45) Date of Patent: Jul. 6, 2021

(54) METHOD AND SYSTEM FOR TESTING ANTENNA ARRAY USING MIDDLE FIELD ANTENNA PATTERN

(71) Applicant: Keysight Technologies, Inc., Santa Rosa, CA (US)

(72) Inventors: Ya Jing, Beijing (CN); Hong-Wei Kong, Beijing (CN); Zhu Wen, Beijing (CN)

(73) Assignee: Keysight Technologies, Inc., Santa Rosa, CA (US)

( * ) Notice: Subject to any disclaimer, the term of this patent is extended or adjusted under 35 U.S.C. 154(b) by 100 days.

(21) Appl. No.: 16/367,642

(22) Filed: Mar. 28, 2019

(65) Prior Publication Data

US 2020/0028598 A1    Jan. 23, 2020

(51) Int. Cl.
*G01R 29/10* (2006.01)
*H04B 17/10* (2015.01)
*H04B 17/12* (2015.01)

(52) U.S. Cl.
CPC ........... *H04B 17/102* (2015.01); *G01R 29/10* (2013.01); *H04B 17/12* (2015.01)

(58) Field of Classification Search
CPC ............... G01R 29/10; G01R 29/0878; G01R 29/0821; G01R 33/34038; G01R 27/267; H04B 17/12; H04B 17/102
See application file for complete search history.

(56) References Cited

U.S. PATENT DOCUMENTS

| 5,204,685 | A  | * | 4/1993 | Franchi ................. G01R 29/10 342/360 |
| 5,432,523 | A  |   | 7/1995 | Simmers et al. |
| 9,288,696 | B2 |   | 3/2016 | Szini et al. |
| 9,985,733 | B1 |   | 5/2018 | Lee et al. |
| 10,033,473 | B1 | * | 7/2018 | Kyrolainen ............ H04B 17/15 |
| 10,587,350 | B2 |   | 3/2020 | Rodriguez-Herrera et al. |

(Continued)

FOREIGN PATENT DOCUMENTS

CN    111371513 A    7/2020

OTHER PUBLICATIONS

Notice of Allowance dated Mar. 3, 2021, U.S. Appl. No. 16/367,642, 13 pgs.

*Primary Examiner* — Jermele M Hollington
*Assistant Examiner* — Taqi R Nasir

(57) ABSTRACT

A method is provided for testing an antenna array of a DUT using a probe antenna, the antenna array including multiple antenna elements. The method includes providing a correction table that includes predetermined correction data of differences between far field antenna patterns from different positions in a far field of the antenna array and a middle field antenna pattern from a position in a middle field of the antenna array, where the middle field satisfies near field criteria for the antenna array and satisfies far field criteria for each antenna element in the antenna array; measuring an antenna pattern at a first position in the middle field of the antenna array; retrieving predetermined correction data from the correction table corresponding to a second position located in the far field of the antenna array; and translating the measured antenna pattern to the far field by adding the retrieved predetermined correction data.

20 Claims, 8 Drawing Sheets

(56) References Cited

U.S. PATENT DOCUMENTS

| | | | |
|---|---|---|---|
| 2003/0117315 A1* | 6/2003 | Graham | ............... G01R 29/10 |
| | | | 342/174 |
| 2013/0027256 A1 | 1/2013 | Guo et al. | |
| 2014/0273873 A1 | 9/2014 | Huynh | |
| 2018/0062971 A1* | 3/2018 | Kyosti | ................... H04L 43/50 |
| 2020/0213016 A1 | 7/2020 | Jing et al. | |

* cited by examiner

METHOD AND SYSTEM FOR TESTING ANTENNA ARRAY USING MIDDLE FIELD ANTENNA PATTERN

CROSS-REFERENCE TO RELATED APPLICATION

A claim for priority under 35 U.S.C. § 119 is made to Chinese Patent Application No. 201810522765.X, filed on May 28, 2018, in the State Intellectual Property Office of the People's Republic of China, the entire contents of which are hereby incorporated by reference.

BACKGROUND

Antenna arrays are increasingly used in electronic communications, including in the wireless telecommunications industry, for example. Antenna array test and calibration solutions are used, in part, to measure antenna patterns of the antenna arrays. Conventional solutions depend on a vector network analyzer, which requires the device under test (DUT) including the antenna array to have radio frequency (RF) connectors, such as coaxial connectors, in order to perform the test and calibration. However, with the evolution of wireless communication technologies, antenna arrays with direct connections to (i.e., integrated with) RF transceivers of DUTs, and having no RF connectors, are becoming increasingly common. Overall performance of such a DUT presently must be tested "over-the-air," since there is no place to connect a coaxial cable from the DUT and/or the antenna array to test equipment. In fact, due to antenna array integration, overall DUT performance is now tested as a function of the antenna array configuration. When the antenna array is designed to produce RF signals (antenna beams), for instance, then the DUT performance must be characterized over a range of beam angles and/or widths.

Conventional solutions for over-the-air testing are aimed primarily at single antenna measurements. However, with the advent of millimeter wave (mmW) bands and corresponding wireless communication standards, such as IEEE 802.11ad, as well as the advent of 5G networks, cost, size and speed become key attributes of test methodology. Generally, antenna pattern measurements typically take place either at an outdoor test range or in a chamber test range. Outdoor test ranges are used for antennas having a very long far field (e.g., greater than 100 m), rendering use of an indoor test range or chamber impractical. Test chambers are used for antennas having shorter far fields or for measuring near field characteristics, which are mathematically transformed to far field characteristics. The test chambers may be anechoic test chambers, which are shielded, having walls covered in absorbing material that minimizes internal reflections, typically by several tens of decibels.

In wireless communication systems, measurement metrics of a base station's antenna pattern (e.g., radiated power in specific directions) are mandatory, as required by standards. For example, equivalent isotropic radiated power (EIRP) testing in 3GPP Technical Specification 38.104 requires measuring radiated power for each beam direction of the antenna array. This requirement is also driven by wireless operators for network construction and optimization. According to conventional solutions, the antenna pattern of a device can be measured in two ways. First, the radiated power may be measured directly in the far field. Second, a three-dimensional (complex) antenna pattern measurement may be performed including amplitude and phase information in the near field, and each measurement in the near field is mathematically transformed to the far field using a complex mathematical solution. Both methods have corresponding disadvantages. For example, to support 5G technology, base stations adopting massive multiple-input and multiple-output (MIMO) technologies have very large antenna arrays, which present challenges to setting up an actual far field test environment. For example, for a 32×32 antenna array with half wavelength or half lambda ($\lambda$) antenna spacing of 28 GHz, the far field test distance is larger than 11 meters. It is very expensive and time consuming to set up such a large test chamber, and the space requirement is a challenge as well. Further, a large distance means large propagation loss inside the chamber (or in the outdoor test range), making it difficult to meet the link budget requirement for performing accurate measurements.

A conventional near field test typically uses a much smaller distance between the probe antenna of the test system and the DUT, e.g., a ratio of three to ten wavelength, and also uses the near field to far field translation to derive the far field antenna pattern based on the measured near field complex antenna pattern. However, such an approach has practical limitations for the active massive MIMO device test as well. To determine the far field antenna pattern, the measured near field antenna pattern should cover a majority of the radiated beams of the near field complex antenna pattern, which is very time consuming. This is especially true when only the beam peak power or 3 dB beam power measurement is needed. Also, conventional near field to far field translation only applies to continuous waveform (CW) signals, and not to broadband modulated signals. Further, the near field to far field translation ultimately requires performance of the complex mathematical solution, which is requires significant expenditure of computational time and resources, as mentioned above.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements throughout the drawings and written description.

DETAILED DESCRIPTION

Figure 1:
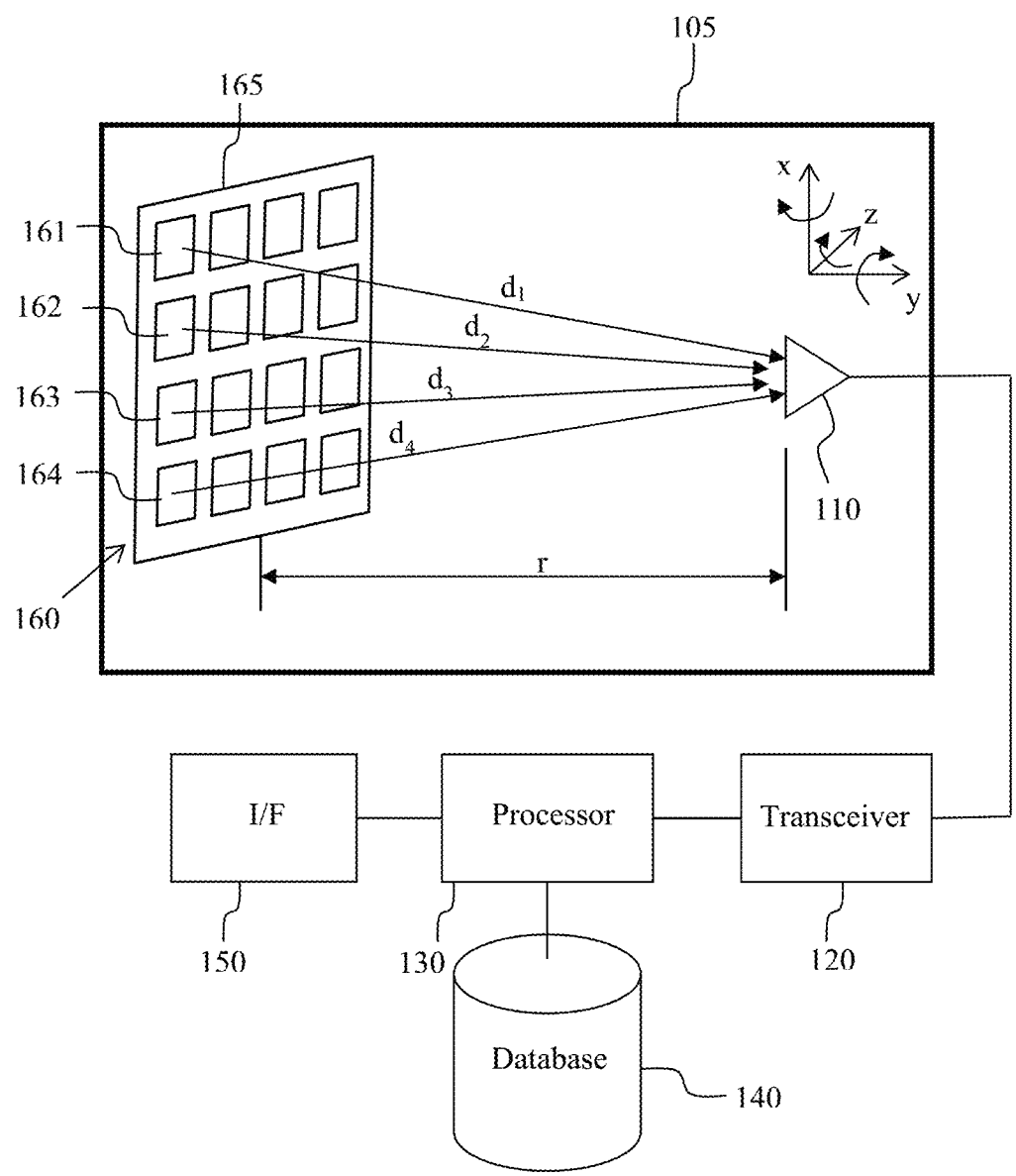
FIG. 1 is a simplified block diagram of a test system for determining a far field antenna pattern of an antenna array, including multiple antenna elements, of a device under test (DUT), according to a representative embodiment.

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree to one of ordinary skill in the art. The term "approximately" means to within an acceptable limit or amount to one of ordinary skill in the art. Relative terms, such as "above," "below," "top," "bottom," "upper" and "lower" may be used to describe the various elements" relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

According to various embodiments, test systems and methods are provided for testing a device under test (DUT), such as a base station or a mobile communication device, that includes an antenna array with multiple antenna elements. Measurements (and corrections) of antenna array beam radiated power may be made using a probe antenna of the test system for receiving radio frequency (RF) signals from the antenna array, where the probe antenna is located in a middle field of the DUT. The middle field refers to a distance from the DUT that satisfies the far field requirement for each individual antenna array element, but is still the near field for the antenna array itself. Accordingly, the antenna pattern for a main beam of the antenna array may be measured in the middle field (e.g., by measuring the radiated power of the main beam) and then corrected, by merely adding middle field to far field difference data, retrieved from a previously populated correction table, to derive the corresponding far field antenna pattern. As compared to conventional direct far field measurements, a large test chamber is not required, addressing issues regarding expense, space and excessive path loss during testing. As compared to conventional near field testing, including mathematical transformation from near field to far field, the embodiments can test EIRP, for example, very quickly and do not need complex antenna pattern measurements or complex mathematical translations.

FIG. 1 is a simplified block diagram of a test system for determining a far field antenna pattern of an antenna array, including multiple antenna elements, of a DUT, according to a representative embodiment.

Referring to FIG. 1, test system 100 includes a chamber 105 that contains a probe antenna 110 for receiving RF signals from an antenna array 165 of representative DUT 160. In an embodiment, the chamber 105 may be an anechoic chamber with electromagnetic wave absorbing material, such as absorbing foam, covering the interior walls. The electromagnetic wave absorbing material minimizes reflections from the internal walls, e.g., by several tens of decibels, reducing interference during testing of the antenna array 165. The probe antenna 110 may be rotatable in order to accommodate measurement of power in two-dimensional (2D) and/or three-dimensional (3D) antenna patterns radiated from the antenna array 165 in different directions. The rotation may take place around one or more axes, indicated by the curved arrows around the x, y and z axes of the coordinate grid shown in FIG. 1. The rotation of the probe antenna 110 may be controlled by processor 130, for example, as discussed below.

The antenna array 165 includes a 4×4 array of antenna elements, including representative antenna elements 161, 162, 163 and 164. The probe antenna 110 is positioned a test distance r from the antenna array 165, which is in a middle field of the antenna array 165. The test distance r is taken from a rotation center of the antenna array 165. The middle field is defined as an area within the chamber 105 that satisfies near field criteria for the antenna array 165 and also satisfies far field criteria for each antenna element (including the antenna elements 161, 162, 163 and 164) of the multiple antenna elements in the antenna array 165. More generally, the antenna array 165 comprises an M×N array of antennae, where M and N are positive integers, respectively, e.g., separated from one another by $\lambda/2$. Of course other sizes and arrangements of antenna arrays (or of multiple antennas not operating as an antenna array) may be implemented without departing from the scope of the present teachings. The antenna elements 161, 162, 163 and 164, for example, provide analog mmW RF signals to the probe antenna 110 over distances $d_1$, $d_2$, $d_3$ and $d_4$, respectively, in accordance with corresponding element antenna patterns.

In the depicted embodiment, for purposes of illustration, the test system 100 further includes transceiver 120, the processor 130, memory 140 and user interface (I/F) 150. The transceiver 120 is configured to receive the RF signals from the DUT 160 in a receive mode via the probe antenna 110. The transceiver 120 may also transmit RF signals to the DUT 160 in a transmit mode via the probe antenna 110, although for ease of illustration, the functionality of the test system 100 is described with the transceiver 120 in the receive mode. It is understood that the description herein applies to the transceiver 120 in the transmit mode, as well. The transceiver 120 is shown outside the chamber 105, and configured to communicate with the probe antenna 110 over a physical connection (as shown), such as a cable, passing through the wall(s) of the chamber 105. Alternatively, the transceiver 120 may communicate wirelessly with the probe antenna 110, without departing from the scope of the present teachings.

The processor 130 is programmed to control the positioning of the probe antenna 110, and to perform the antenna pattern measurements of the antenna array 165 and the individual antenna elements, including the representative antenna elements 161, 162, 163 and 164, using demodulated signals received from the transceiver 120. Measuring antenna patterns may be performed by measuring the radiated power of one or more beams from the antenna array 165 and/or from the individual antenna elements. In an embodiment, measuring the antenna pattern of the antenna array 165 refers to measuring radiated power of a main beam (or main lobe) of the antenna array 165.

The memory 140 is configured to store at least a portion of the antenna pattern measurement results, and to store predetermined correction data that includes differences between far field antenna patterns from different positions in a far field of the antenna array 165 and a middle field antenna pattern from a position in the middle field of the antenna array 165, discussed above. The memory 140 is accessible by the processor 130, which retrieves stored predetermined correction data, corresponding to selected positions in the far field of the antenna array 165, and adds the predetermined correction data to a measured antenna pattern at a position in the middle field of the antenna array 165 to determine the far field antenna patterns.

Figure 4:
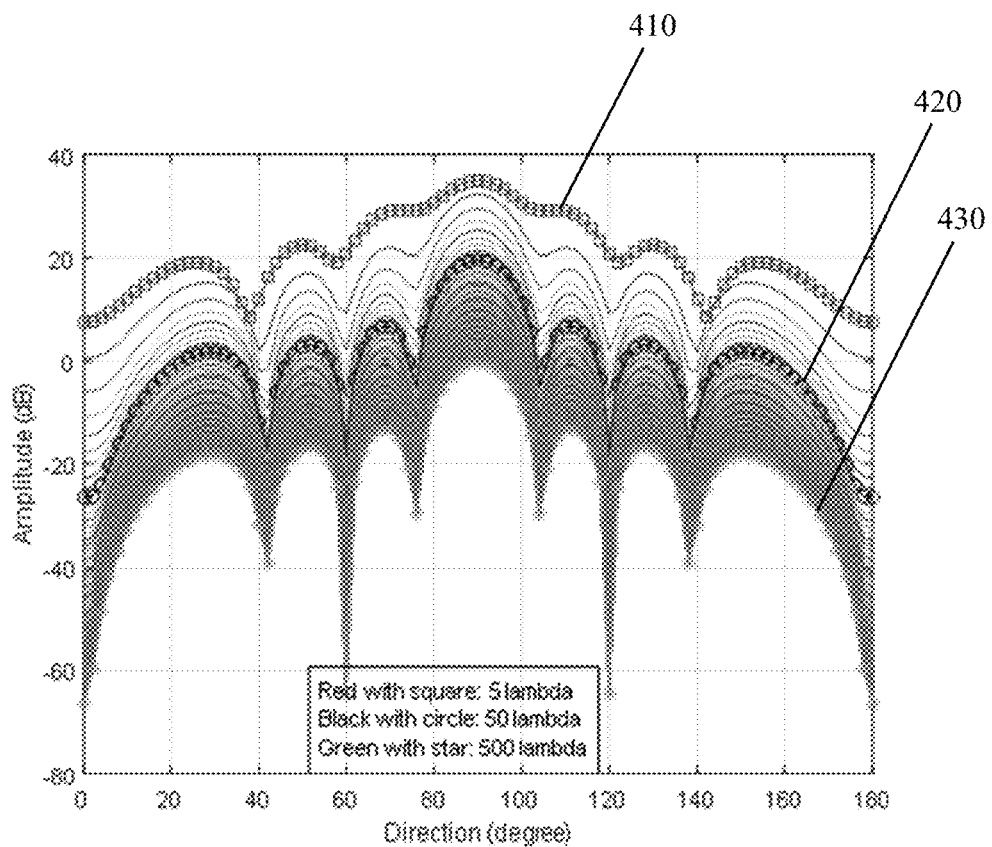
FIG. 4 is a plot showing examples of calculated antenna patterns at different test distances, according to a representative embodiment.

The I/F 150 enables interfacing with a user and/or another test device. The I/F 150 may include a display (not shown) configured to display antenna patterns corresponding to different near field and far field positions (e.g., an example of which is shown in FIG. 4) and at least a portion of the testing results. The I/F 150 may also include a user input device (not shown) configured to receive user commands and/or data entry, such as coordinates of positions in the far field of the antenna array 165 for which determination of an antenna pattern is desired. The user input device may include a keyboard, a mouse, a touch pad and/or a touch-sensitive display, although any other compatible means of providing input and receiving output may be incorporated without departing from the scope of the present teachings.

The processor 130 may be implemented by a computer processor, application specific integrated circuits (ASICs), field-programmable gate arrays (FPGAs), or combinations thereof, using software, firmware, hard-wired logic circuits, or combinations thereof. A computer processor, in particular, may be constructed of any combination of hardware, firmware or software architectures, and may include its own memory (e.g., nonvolatile memory separate from the memory 140) for storing executable software/firmware executable code that allows it to perform the various functions. In an embodiment, the computer processor may comprise a central processing unit (CPU), for example, executing an operating system.

The memory 140 may be implemented by any number, type and combination of random access memory (RAM) and read-only memory (ROM), for example, and may store various types of information, such as computer programs and software algorithms executable by the processor 130 (and/or other components), as well as raw data and/or testing and measurement data storage, for example. The various types of ROM and RAM may include any number, type and combination of computer readable storage media, such as a disk drive, an electrically programmable read-only memory (EPROM), an electrically erasable and programmable read only memory (EEPROM), a CD, a DVD, a universal serial bus (USB) drive, and the like, which are tangible and non-transitory storage media (e.g., as compared to transitory propagating signals).

Figure 2:
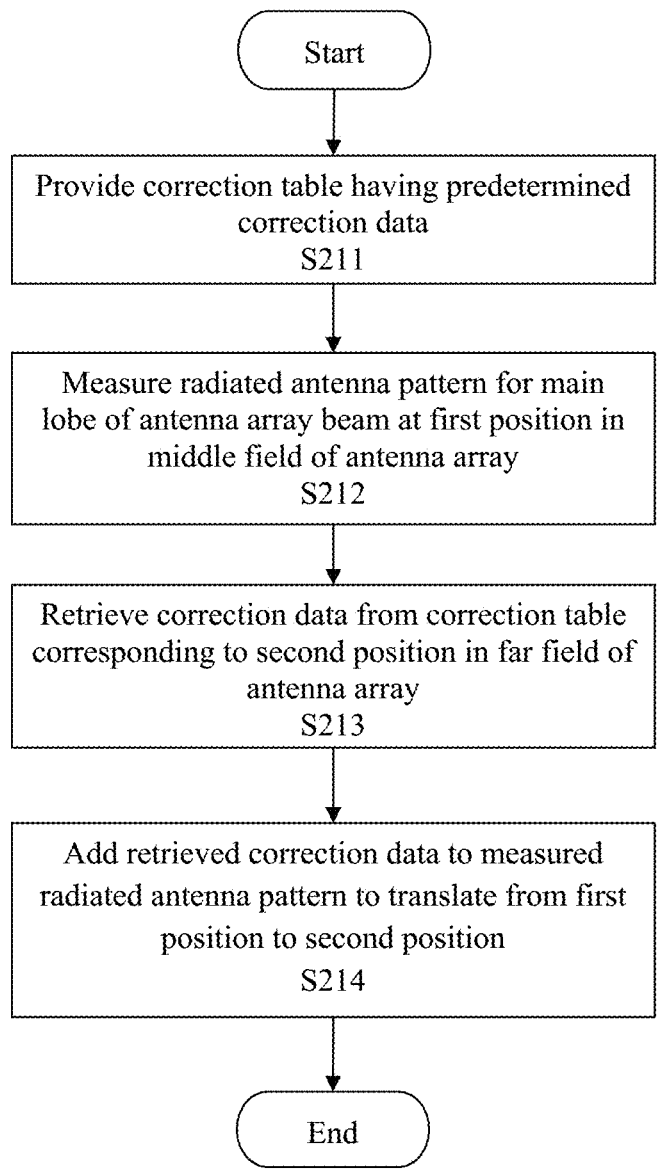
FIG. 2 is a flow diagram showing a method for testing an antenna array of a DUT using a probe antenna in a middle field of the antenna array, according to a representative embodiment.

FIG. 2 is a flow diagram showing a method for testing an antenna array of a DUT using a probe antenna in a middle field of the antenna array, according to a representative embodiment.

Referring FIG. 2, the method includes providing a correction table in block S211. For example, the correction table may be stored in the memory 140 of the illustrative test system 100 shown in FIG. 1. The correction table includes predetermined correction data indicating differences between (i) far field antenna patterns at different positions in a far field of the antenna array 165, or of an antenna array of the same type, and (ii) a middle field antenna pattern from a position in a middle field of the antenna array 165, or of an antenna array of the same type. As discussed above, the middle field of the antenna array 165 is the set of distances from the DUT 160 that satisfy the far field requirement for each individual antenna array element (e.g., including antenna elements 161, 162, 163, 164), but are still within the near field for the antenna array 165. In an embodiment, the correction table may also include different sizes (e.g., number and distribution of antenna elements) of the antenna array, such that correction table may be used with different sized antenna arrays. The correction table may be provided (or populated) using a variety of techniques, discussed below with reference to FIGS. 3A-3D.

In block S212, an antenna pattern of the antenna array 165 is measured at a first position relative to the antenna array 165 using the probe antenna 110. The antenna pattern measurement may include measuring radiated power of a main beam of the antenna array 165, for example. The first position is located in the middle field of the antenna array 165 (e.g., at the test distance r, as shown in FIG. 1). In block S213, predetermined correction data is retrieved from the correction table corresponding to a second position relative to the antenna array 165 located in the far field of the antenna array 165. The second position may be determined by a user, for example, as the location for which the antenna pattern is sought. For purposes of explanation, the second position corresponds to one of the different positions in the far field of the antenna array 165 included in the correction table.

In block S214, the retrieved predetermined correction data is added to the measured antenna pattern for the main beam of the antenna array 165. The addition of the retrieved predetermined correction data translates the measured antenna pattern from the first position in the middle field to the second position in the far field of the antenna array. No other calculation need be performed on the measured antenna pattern to make the translation, thus saving significant computational time and resources, as compared to conventional techniques for translating near field antenna patterns of an antenna array to the far field. The addition may be performed, for example, by adding the predetermined correction data to the radiated power of the measured antenna pattern corresponding to different directions (test angles) of the measured antenna pattern. That is, for each test angle, the predetermined correction data for that specified direction is added since the predetermined correction data may be different for the different test angles.

With regard to block S211, the correction table is populated with correction data entries (i.e., difference data) prior to determination of the antenna pattern of the antenna array 165 at the first position in the middle field and/or selection of the second position in the far field antenna pattern of the antenna array 165. A number of techniques may be used to populate the correction table, all of which result in difference data (i.e., indicating differences in power between the first position in the middle field and distances/directions in the far field). The difference data correspond to distances greater than a far field threshold in various directions, over which the far field criteria of the measured radiated power (e.g., EIRP) are satisfied for the antenna array 165, or of an antenna array of the same type. When the far field criteria are satisfied, the antenna pattern will be independent of the test position because the power loss caused by the test distance will be removed from the corresponding measured radiated power. As discussed above, the difference data may simply be added to the measured antenna pattern of the antenna array 165 at the first position (e.g., measured radiated power or EIRP for the main beam) to obtain the antenna pattern for the antenna array 165 at a second position in the far field, thereby avoiding complex translation calculations between near field and far field antenna patterns, as in the conventional systems and methods. Moreover, the correction table is not populated using these conventional complex translation calculations between near field and far field antenna patterns, avoiding use of the conventional complex translation calculations altogether.

Generally, the correction data are determined based on geometry data for the antenna array 165, distance information between the probe antenna 110 and the DUT 160, carrier frequency of the RF signal, and beam directions of the antenna array 165. Also, it is understood that the predetermined correction data in the correction table is applicable to the antenna arrays of the same type, such that each individual antenna array (e.g., such as the antenna array 165) does not need to have its own, customized correction table. That is, one correction table may be populated for a particular type of antenna array, e.g., pursuant to testing/training by the manufacturer, and supplied to the user along with the antenna array. This enables translations to be made from the middle field to the far field of the user's antenna array simply by adding the appropriate entry (corresponding to the far field position) of the predetermined correction table for the same type of antenna array to the measured antenna pattern of the user's antenna array in the middle field (e.g., within chamber 105). Illustrative techniques for providing the predetermined correction data are described below.

Figure 3A:
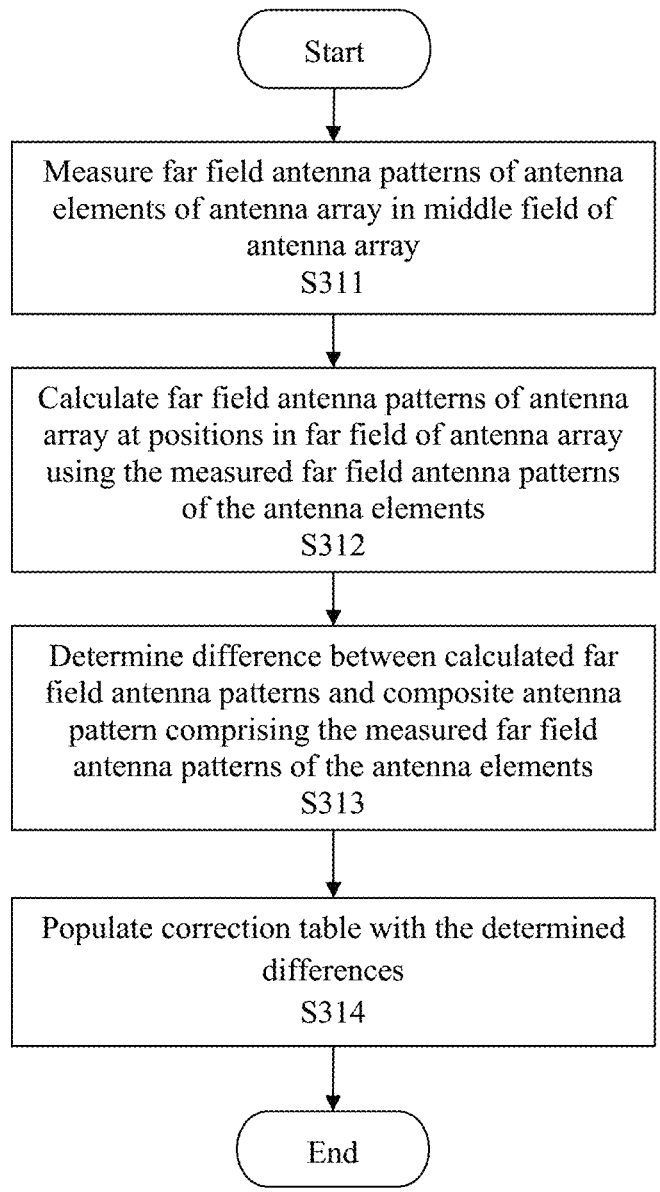
FIG. 3A is a flow diagram showing a method of determining the predetermined correction data to be included in the correction table, according to a representative embodiment.

FIG. 3A is a flow diagram showing a method of determining the predetermined correction data to be included in the correction table, according to a representative embodiment. The method depicted in FIG. 3A includes measuring far field antenna patterns of the multiple antenna elements (e.g., antenna elements 161, 162, 163, 164) in the antenna array 165 in the middle field of the antenna array 165, or an antenna array of the same type, in block S311. The measurements may be performed by the manufacturer of the antenna array 165 (before distribution) using the antenna array 165, or using an antenna array of the same type, and a probe antenna 110 during a calibration or training process. For example, the far field antenna patterns of the antenna elements 161, 162, 163, 164 are determined for distances $d_1$, $d_2$, $d_3$, $d_4$, respectively.

In block S312, the far field antenna patterns of the antenna array 165 are calculated at different positions in the far field of the antenna array 165, or an antenna array of the same type, using the measured far field antenna patterns of the multiple antenna elements from block S311. In block S313, a difference is determined between each of the calculated far field antenna patterns of the antenna array 165 and a composite antenna pattern, where the composite antenna pattern is determined from the measured far field antenna patterns of the multiple antenna elements. For example, in the present embodiment, the composite antenna pattern is the middle field antenna pattern determined using Equation (1), discussed below. The correction table is populated with the determined differences in block S314.

Referring again to block S312, in an embodiment, calculating the far field antenna patterns of the antenna array 165 for the correction table at the different positions (e.g., different test distances r and different azimuth and elevation angles ($\vartheta$, $\phi$)) in the far field of the antenna array 165 includes performing Equation (1), below, for each of the different positions in the far field. Notably, the antenna elements (e.g., antenna elements 161, 162, 163, 164) of antenna array 165 do not share the same distance d, angle of arrival (AoA) and angle of departure (AoD) in relation to the probe antenna 110. Therefore, the far field antenna pattern of the antenna array 165 at test distance r can be expressed by Equation (1), where y is the antenna pattern for the main beam of the antenna array 165:

$$y(v, \phi, r) = \sum_{k=1}^{N} x_k G_k(\theta_k, \varphi_k) \frac{\lambda}{4\pi d_k} \exp\left(j2\pi \frac{d_k}{\lambda}\right) G_P(v_k, \phi_k) \quad \text{Equation (1)}$$

Referring to Equation (1), the variables ($\vartheta$, $\phi$, r) indicate the position of the probe antenna 110 related to the rotation center of the antenna array 165, where ($\vartheta$, $\phi$) are azimuth and elevation angles, respectively, and (r) is an absolute distance (test distance) between the rotation center of the antenna array 165 and the probe antenna 110. With respect to the antenna elements in the antenna array 165, k is an antenna element index for the antenna array, and N is the number of antenna elements contributing to a beam of the antenna array 165, where k and N are each positive integers. When the far field antenna pattern of each of the antenna elements is known, Equation (1) is true for the main beam of the antenna array 165. But, when the far field antenna patterns of fewer than all of the antenna elements are known, Equation (1) is applied only to estimate the main beam of the antenna array 165. Also, in the example depicted in FIG. 1, N would be equal to 16, and values of k would be equal to 1, 2, 3 . . . 16.

Still referring to Equation (1), $G_k$ is a far field complex antenna pattern for antenna element k of the multiple antenna elements, ($\theta_k$, $\varphi_k$) are azimuth and elevation angles, respectively, of antenna element k of the multiple antenna elements relative to the probe antenna 110, $d_k$ is a distance between antenna element k of the multiple antenna elements to the probe antenna 110, and $x_k$ is a stimulus signal for antenna element k of the multiple of antenna elements. Further, $\lambda$ is the wavelength of the RF signal comprised of beams transmitted by the antenna array 165, $G_P$ is a far field complex antenna pattern for the probe antenna 110, ($\vartheta_k$, $\phi_k$) are azimuth and elevation angles, respectively, of the probe antenna 110 relative to antenna element k of the multiple antenna elements, $$\frac{\lambda}{4\pi d_k}$$

is path loss, and $$2\pi \frac{d_k}{\lambda}$$

is phase variation caused by propagation over distance $d_k$. Because for each individual antenna element, the distance $d_k$ is already in the far field, each antenna element's far field pattern can be used, and the corresponding path loss may be regarded as $$\frac{\lambda}{4\pi d_k}.$$

Based on Equation (1), the antenna pattern of the antenna array 165 at different test distances r in the far field may be calculated based, in part, on the test distances $d_k$, all of which are in the middle field of the antenna array 165.

Stated differently, assuming y is the received signal at test distance r, then the power of the received signal y is dependent on the test distance r. However, when the antenna pattern in the far field is derived, the influence of the test distance r may be easily removed by adding path loss to the power of the received signal y. Accordingly, for the far field, the difference between the received signal y and the antenna pattern is one constant number (the path loss). That is, y is the received signal at test distance r, and the antenna pattern can be derived from y by calibrating out the path loss.

Because Equation (1) is able to calculate the antenna pattern (in amplitude or power) for the antenna array 165 at different test distances r, in the middle field and in the far field, the difference may be determined by subtracting the calculated antenna patterns corresponding to the two different test distances r. For example, using Equation (1), antenna pattern y_1 may be calculated assuming r=1 m (which is assumed to be in the middle field), and antenna pattern y_2 may be calculated assuming r=10 m (which is assumed to be in the far field). The difference between the antenna patterns may then be calculated as y_diff=y_2−y_1. Notably, the difference y_diff contains two parts: (i) free-space path loss change, caused directly by the change in test distances, and (ii) composite beam gain variation under the different test distances. The free-space path loss change resulting from the different test distances (1 m and 10 m) can be calculated using a well known free-space path loss equation. Then, the path loss change is deducted from the difference y_diff to determine the difference between the radiated power of a main beam in the antenna array far field and the radiated power of the main beam in the antenna array middle field. This difference also is regarded as the correction number to be entered in the correction table.

FIG. 4 is a plot showing examples of calculated antenna patterns at different test distances r, according to a representative embodiment, based on the assumption that the antenna array is an 8×8 array of antenna elements with half lambda (λ) separation in an omni-directional array of antenna elements, showing a main beam direction of 90 degrees. In particular, FIG. 4 shows variations in the antenna pattern shapes of the antenna array as a function of increasing test distances. Referring to FIG. 4, each of curves 410, 420 and 430 represents a different fixed test distance r. As the test distance r increases, the measured power decreases. In particular, curve 410 represents the antenna pattern of the 8×8 antenna array at a distance of 5λ, where λ is the wavelength of the RF signal. Also, curve 420 represents the antenna pattern at a test distance of 50λ and curve 430 represents the antenna pattern at a test distance of 500λ. In this example, 5λ is in the near field, 50λ is in the middle field (defined above), and 500λ is in the far field of the antenna array. So, the curves 410 and 420 may be measured in the chamber 105, while the curve 430 is derived using Equation (1).

Figure 5:
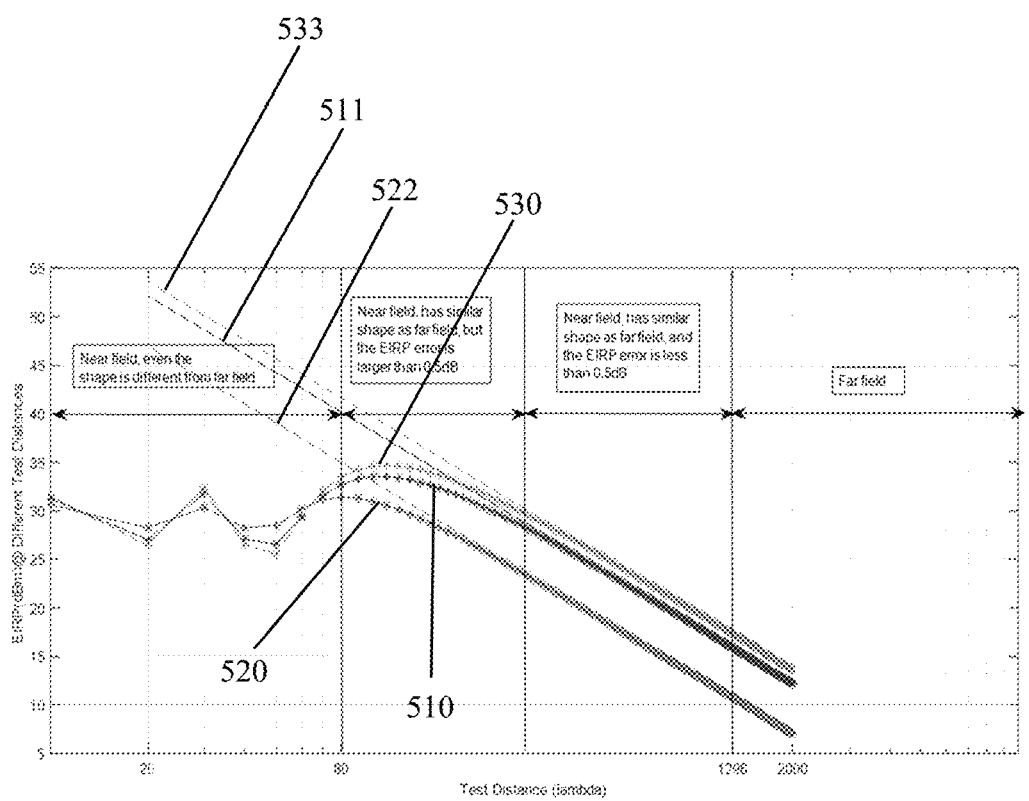
FIG. 5 is a plot showing examples of near field and far field antenna patterns of an antenna array, according to a representative embodiment.

FIG. 5 is a plot showing examples of near field and far field antenna patterns of an antenna array, according to a representative embodiment, based on the assumption that the antenna array is a 36 by 36 array of antenna elements with half λ separation in an ideal omni-directional antenna array, showing a main beam direction of 90 degrees. Referring to FIG. 5, curves 510, 520 and 530 correspond to three points on the main beam (or the main lobe), where curve 530 corresponds to the center point of the main beam, and curves 510 and 520 correspond to adjacent points to the center point of the main beam. The propagation directions are used for calculating measured power variation as test distance r increases, where the power is indicated on the vertical axis as equivalent isotropic radiated power (EIRP) and the test distance is indicated on the horizontal axis in multiples of λ. Curves 511, 522 and 533 correspond to ideal path loss of the whole antenna array, satisfying 2πr/λ, where curves 511, 522 and 533 correspond to curves 510, 520 and 530, respectively, and may be established during calibration or training, for example.

The real near field range of the antenna array includes test distances less than 1296λ, and the real far field range of the antenna array includes test distances greater than 1296λ. When the test distance is greater than 1296λ, the path loss for the whole antenna array satisfies 2πr/λ, and thus the curves 510, 520 and 530 become substantially linear, overlapping the corresponding curves 511, 522 and 533, respectively. In comparison, when the test distance is greater than 80λ and less than 1296λ (which may be referred to as the radiated near field region, which corresponds to the middle field), the beam pattern gain of the antenna array is not yet fully formed, although it approaches linearity. So, the path loss for the whole antenna array does not satisfy 2πr/λ. However, in the middle field, the difference between each point on the curves 510, 520 and 530 and a corresponding point on the curves 511, 522 and 533, respectively, may be calculated to determine power differences. The power differences can be used as the power calibration number when performing near field antenna array measurement. Accordingly, the antenna array's EIRP can be measured in the middle field with power calibration. When the test distance is less than 80λ (which may be referred to as the reactive near field region), the beam pattern gain of the antenna array does not present a stable test environment.

Notably, referring to FIG. 5, the separation distances between points on the curve 530 and corresponding points on the curve 533 are representative of difference data entries used to populate the correction table, discussed above. That is, the difference data in the correction table may be added to the curve 530 in the middle field in order to provide the far field antenna pattern corresponding to the different test differences. Likewise, to the extent the correction table covers neighboring directions close to the main lobe, the separations between points on the curves 510 and 520 and corresponding points on the curves 511 and 522 are also representative of difference data entries used to populate the correction table.

The data forming the curves 510, 520 and 530 in FIG. 5 are calculated using Equation (1). That is, by setting the test distance r of the probe antenna 110 to larger than the far field requirement, the antenna pattern for the main beam of the antenna array (beam pattern) in the far field can be derived using Equation (1). The difference between the far field beam pattern and the near field beam pattern measured in the middle field of the antenna array 165 (i.e., the far field of the antenna elements) can be used to correct the near field beam pattern measurement results to obtain the corresponding far field results without having to perform actual measurements in the far field of the antenna array 165.

From Equation (1), it can be seen that when all the antenna patterns of the antenna elements ($G_k$) are the same, then the difference to correct the antenna pattern of the antenna array from the measured near field beam pattern to the far field is independent of the antenna patterns of the antenna elements. That is, the difference to correct the measured near field beam pattern to the far field only depends on the shape of the antenna array and geometric positioning with respect to the probe antenna 110.

In reality, though, the antenna patterns of the antenna elements may have some differences, especially for the antenna elements positioned at the edges of the antenna array. However, based on Equation (1), it can be seen that the assumption that all the antenna elements have the same antenna pattern introduces acceptable correction errors, especially for the portions of the antenna pattern of the antenna array 165 where the gain is relatively large when a reasonable distance between the probe antenna 110 and the antenna array 165 is chosen (e.g., greater than about 1/5 of real far field test distance of the antenna array) and the number of antenna elements in the antenna array is large (e.g., greater than or equal to about 64), although other distances and numbers of antenna element may be incorporated without departing from the scope of the present teachings. The differences between the antenna patterns of the antenna elements will result in much larger estimation error for the nulling depth measurement in this case, but the position of nulling point(s) will still be very close to that measured in far field.

Figure 3B:
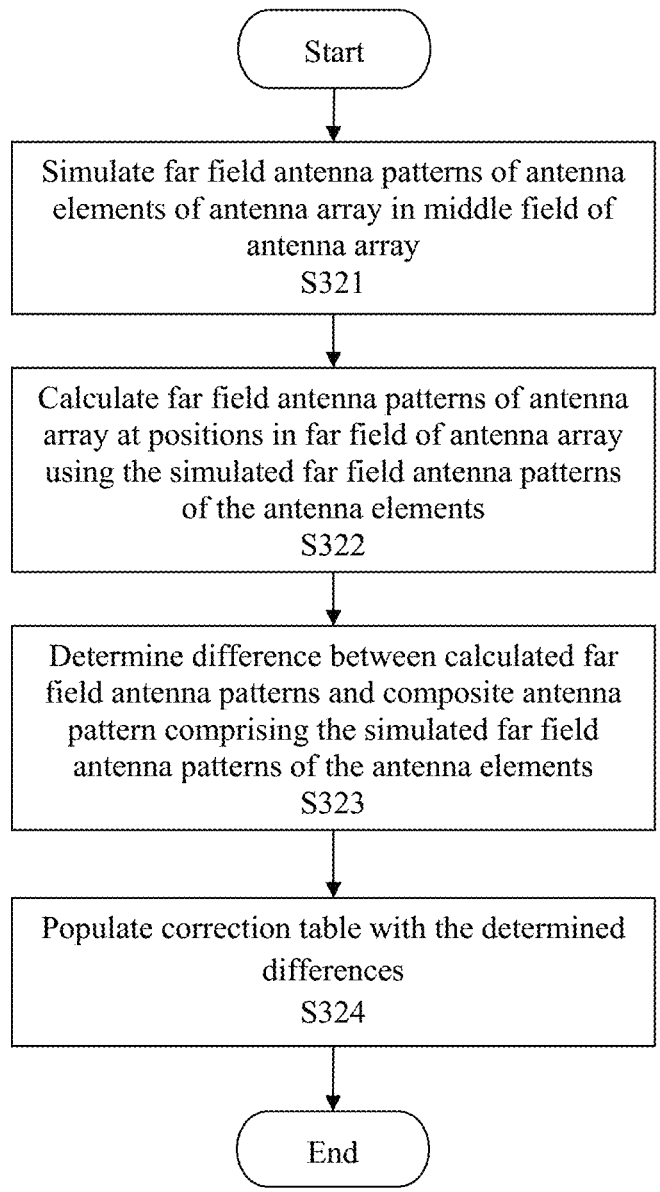
FIG. 3B is a flow diagram showing another method of determining the predetermined correction data to be included in the correction table, according to a representative embodiment.

FIG. 3B is a flow diagram showing another method of determining the predetermined correction data to be included in the correction table, according to a representative embodiment. Referring to FIG. 3B, the method includes simulating far field antenna patterns of the multiple antenna elements (e.g., antenna elements 161, 162, 163, 164) in the antenna array 165 in the middle field of the antenna array 165, e.g., using software simulation, in block S321. The simulations may be performed by the manufacturer of the antenna array 165 (before distribution) based on the antenna array 165, or based on an antenna array of the same type, during a calibration or training process. The simulations may be performed, for example, using simulation tools, such as Electromagnetic Professional (EMPro) available from Keysight Technologies, Inc., or a High Frequency Structure Simulator (HFSS), generally, which are able to generate antenna element patterns based on electromagnetic field simulations.

In block S322, the far field antenna patterns of the antenna array 165 are calculated at different positions in the far field of the antenna array 165 using the simulated far field antenna patterns of the multiple antenna elements from block S321. In an embodiment, calculating the far field antenna patterns of the antenna array 165 at the different positions (e.g., different test distances r and different azimuth and elevation angles ($\vartheta$, $\phi$)) in the far field of the antenna array 165 includes performing Equation (1), as discussed above. In block S323, a difference is determined between each of the calculated far field antenna patterns of the antenna array 165 and a composite antenna pattern, where the composite antenna pattern (also simulated) is determined from the simulated far field antenna patterns of the multiple antenna elements. The correction table is populated with the determined differences in block S324.

Figure 3C:
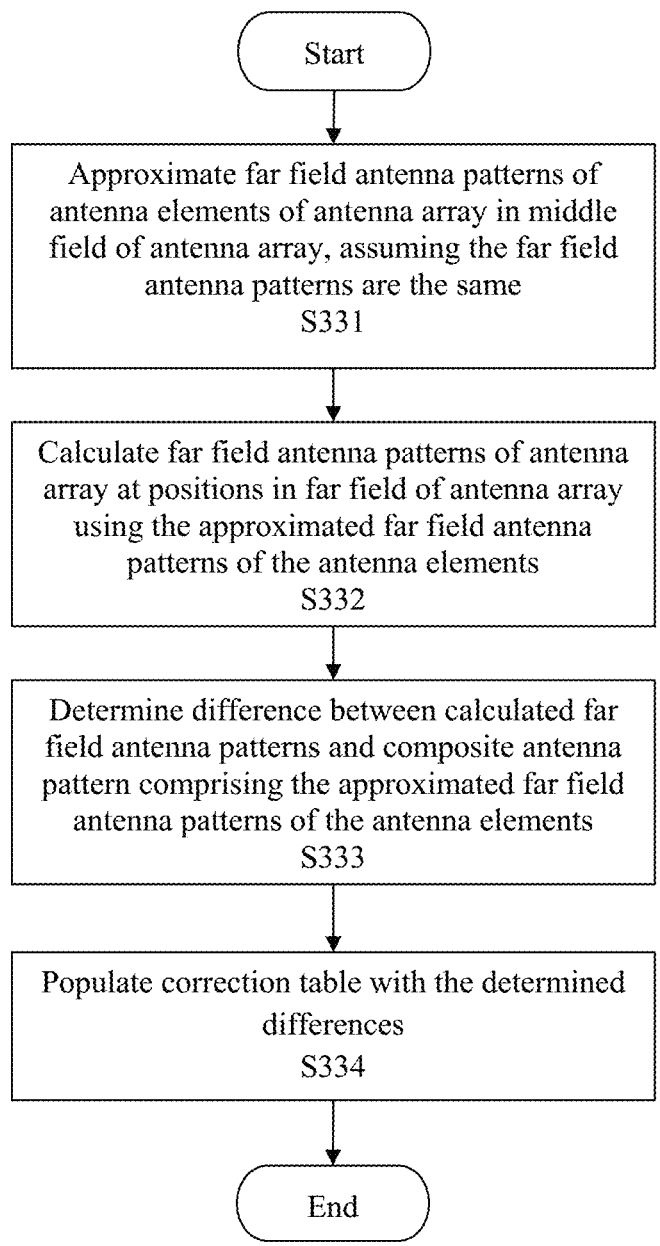
FIG. 3C is a flow diagram showing another method of determining the predetermined correction data to be included in the correction table, according to a representative embodiment.

FIG. 3C is a flow diagram showing yet another method of determining the predetermined correction data to be included in the correction table, according to a representative embodiment. Referring to FIG. 3C, the method includes approximating far field antenna patterns of the multiple antenna elements (e.g., antenna elements 161, 162, 163, 164) in the antenna array 165 in the middle field of the antenna array 165 in block S331. The approximations may be performed by the manufacturer of the antenna array 165 (before distribution) based on the antenna array 165, or based on an antenna array of the same type, during a calibration or training process. The approximations of the far field antenna patterns are made assuming that the far field antenna patterns are the same for all the antenna elements of the antenna array.

In block S332, the far field antenna patterns of the antenna array 165 are calculated at different positions in the far field of the antenna array 165 using the approximated far field antenna patterns of the multiple antenna elements from block S331. In an embodiment, calculating the far field antenna patterns of the antenna array 165 at the different positions (e.g., different test distances r and different azimuth and elevation angles ($\vartheta$, $\phi$)) in the far field of the antenna array 165 includes performing Equation (1), as discussed above. In block S333, a difference is determined between each of the calculated far field antenna patterns of the antenna array 165 and a composite antenna pattern, where the composite antenna pattern (also approximated) is determined from the approximated far field antenna patterns of the multiple antenna elements. The correction table is populated with the determined differences in block S334.

In alternative embodiments, the predetermined correction data included in the correction table may be determined without having to first determine the far field antenna patterns of the multiple antenna elements (e.g., by measurement, computer simulation, approximation, or otherwise), and/or without using Equation (1), as discussed above with reference to FIGS. 3A-3C. For example, FIG. 3D is a flow diagram showing another method of determining the predetermined correction data to be included in the correction table, using far field measurements of the antenna array, according to a representative embodiment.

Figure 3D:
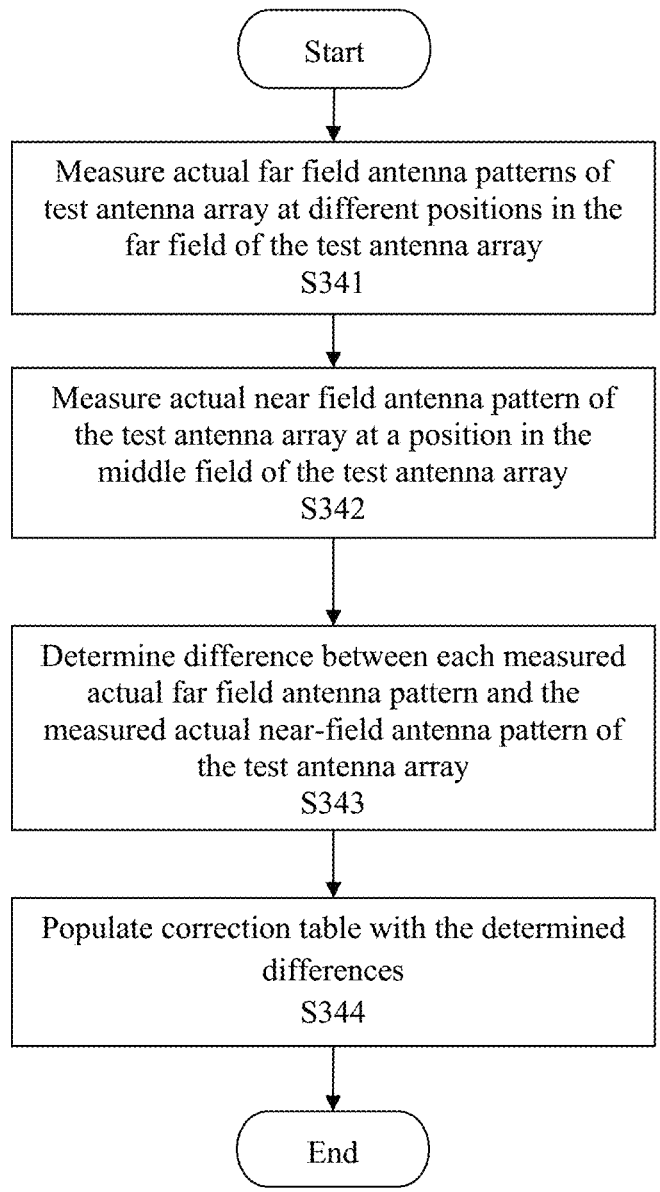
FIG. 3D is a flow diagram showing another method of determining the predetermined correction data to be included in the correction table, using only far field measurements of the antenna array, according to a representative embodiment.

Referring to FIG. 3D, actual far field antenna patterns of a test antenna array are measured in block S341 at the different positions in the far field of the test antenna array. The test antenna array is a same type of antenna array as the one for which far field determinations are being made (e.g., the antenna array 165). In block S342, an actual near field antenna pattern of the test antenna array is measured at a position in the middle field of the test antenna array, where the position corresponds to the first position located in the middle field of the antenna array 165. In block S343, a difference between each of the measured actual far field antenna patterns and the measured actual near field antenna pattern of the test antenna array is determined. The correction table is populated with the determined differences in block S344.

As discussed above, once the correction table is populated with predetermined correction data (or difference data), e.g., using any of the population methods described with reference to FIGS. 3A-3D, the correction table may be provided to a user along with the antenna array, or with an antenna array of the same type. To determine a far field antenna pattern of the antenna array, an antenna pattern of the antenna array is measured at a first position in the middle field of the antenna array. A second position in the far field of the antenna array is identified for determining the far field antenna pattern at the second position. Using the second position (e.g., coordinates identifying relative location to the antenna array) to enter the correction table, predetermined correction data is retrieved from the correction table corresponding to the second position. The retrieved predetermined correction data is added to the measured middle field antenna pattern at the first position to obtain the far field antenna pattern at the second position. No other calculation is needed to make the translation to the far field.

The various components, structures, parameters and methods are included by way of illustration and example only and not in any limiting sense. In view of this disclosure, those skilled in the art can implement the present teachings in determining their own applications and needed components, materials, structures and equipment to implement these applications, while remaining within the scope of the appended claims.

What is claimed:

1. A method for testing an antenna array of a device under test (DUT) using a probe antenna for receiving a radio frequency (RF) signal beam from the antenna array, the antenna array comprising a plurality of antenna elements, the method comprising:
   providing a correction table that includes predetermined correction data comprising differences between far field antenna patterns from different positions in a far field of the antenna array and a middle field antenna pattern from a position in a middle field of the antenna array, wherein the middle field satisfies near field criteria for the antenna array and also satisfies far field criteria for each antenna element of the plurality of antenna elements in the antenna array;
   measuring an antenna pattern for a main lobe of the signal beam of the antenna array at a first position relative to the antenna array using the probe antenna, the first position being located in the middle field of the antenna array;
   retrieving predetermined correction data from the correction table corresponding to a second position relative to the antenna array located in the far field of the antenna array, the second position corresponding to one of the different positions in the far field of the antenna array included in the correction table; and
   determining an antenna pattern of the antenna array in the far field of the antenna array by translating the measured antenna pattern for the main lobe of the signal beam of the antenna array from the first position in the middle field to the second position in the far field of the antenna array by adding the retrieved predetermined correction data to the measured antenna pattern.

2. The method of claim 1, wherein the predetermined correction data included in the correction table is determined by:
   measuring far field antenna patterns of the plurality of antenna elements in the antenna array in the middle field of the antenna array;
   calculating the far field antenna patterns from different positions in the far field of the antenna array based on the measured far field antenna patterns of the plurality of antenna elements; and
   determining a difference between each of the calculated far field antenna patterns and a composite antenna pattern, determined from the measured far field antenna patterns of the plurality of antenna elements, and populating the correction table with the determined differences.

3. The method of claim 1, wherein the predetermined correction data included in the correction table is determined by:
   simulating far field antenna patterns of the plurality of antenna elements in the antenna array in the middle field of the antenna array using software simulation;
   calculating the far field antenna patterns from different positions in the far field of the antenna array based on the simulated far field antenna patterns of the plurality of antenna elements; and
   determining a difference between each of the calculated far field antenna patterns and a composite antenna pattern, determined from the simulated far field antenna patterns of the plurality of antenna elements, and populating the correction table with the determined differences.

4. The method of claim 1, wherein the predetermined correction data included in the correction table is determined by:
   approximating far field antenna patterns of the plurality of antenna elements in the antenna array in the middle field of the antenna array by assuming the far field antenna patterns for all the antenna elements are the same;
   calculating the far field antenna patterns from different positions in the far field of the antenna array based on the approximated far field antenna patterns of the plurality of antenna elements; and
   determining a difference between each of the calculated far field antenna patterns and a composite antenna pattern, determined from the approximated far field antenna patterns of the plurality of antenna elements, and populating the correction table with the determined differences.

5. The method of claim 1, wherein the predetermined correction data included in the correction table is determined by:
   measuring actual far field antenna patterns of a test antenna array, which is a same type of antenna array as the antenna array, at the different positions in the far field of the test antenna array;
   measuring an actual near field antenna pattern of the test antenna array at the position in the middle field of the test antenna array; and
   determining a difference between each of the measured actual far field antenna patterns and the measured actual near field antenna pattern of the test antenna array, and populating the correction table with the determined differences.

6. The method of claim 1, wherein measuring the antenna pattern for the main lobe of the signal beam of the antenna array at the first position comprises measuring radiated power of the main lobe of the signal beam of the antenna array at the first position.

7. A method for testing an antenna array of a device under test (DUT) using a probe antenna for receiving a radio frequency (RF) signal beam from the antenna array, the antenna array comprising a plurality of antenna elements, the method comprising:
   measuring actual radiated power of an antenna pattern for a main lobe of the signal beam of the antenna array using the probe antenna located at an actual distance and direction from the antenna array, the actual distance being in a middle field of the antenna array, wherein the middle field satisfies near field criteria for the antenna array, and also satisfies far field criteria for each antenna element of the plurality of antenna elements in the antenna array;

selecting a correction number from a previously populated correction table using the actual distance and direction from the antenna array, and an actual size of the antenna array, including a number of antenna elements comprising the antenna array; and determining a far field antenna pattern for the main lobe of the signal beam of the antenna array at a position in a far field of the antenna array by adding the selected correction number to the measured actual radiated power of the antenna pattern.

8. A test system for determining an antenna pattern of an antenna array of a device under test (DUT), the antenna array comprising a plurality of antenna elements, the test system comprising:

an antenna probe positioned in a middle field of the antenna array, wherein the middle field includes a distance between the antenna probe and the antenna array that satisfies near field criteria for the antenna array, as a whole, and separately satisfies far field criteria for each antenna element of the plurality of antenna elements in the antenna array;

at least one receiver configured to receive radio frequency (RF) signal beams transmitted from the DUT via the antenna array;

a memory that stores a correction table populated with predetermined correction data comprising differences between far field antenna patterns from different positions in a far field of the antenna array and a middle field antenna pattern from a position in the middle field of the antenna array; and a processor programmed to:
measure radiated power of an antenna pattern for a main lobe of an RF signal beam of the antenna array at a first position relative to the antenna array using the probe antenna, the first position being located in the middle field of the antenna array;

retrieve predetermined correction data from the correction table corresponding to a second position relative to the antenna array located in the far field of the antenna array, the second position corresponding to one of the different positions in the far field of the antenna array included in the correction table; and determine the antenna pattern of the antenna array in the far field of the antenna array by translating the measured radiated power of the antenna pattern for the main lobe of the RF signal beam of the antenna array from the first position in the middle field to the second position in the far field of the antenna array by adding the retrieved predetermined correction data to the measured radiated power.

9. The test system of claim 8, further comprising:
an anechoic test chamber configured to contain the antenna probe and the DUT, wherein a length of the anechoic test chamber is less than the far field of the antenna array.

10. The method of claim 7, wherein the correction table is populated with correction numbers comprising differences between far field antenna patterns from different positions in the far field of the antenna array and middle field antenna patterns from positions in the middle field of the antenna array, and sizes of the antenna array.

11. The method of claim 7, wherein the correction table is populated by:
measuring far field antenna patterns of the plurality of antenna elements in the antenna array in the middle field of the antenna array;

calculating the far field antenna patterns from different positions in the far field of the antenna array based on the measured far field antenna patterns of the plurality of antenna elements; and determining a difference between each of the calculated far field antenna patterns and a composite antenna pattern, determined from the measured far field antenna patterns of the plurality of antenna elements, and populating the correction table with the determined differences.

12. The method of claim 7, wherein the correction table is populated by:
measuring far field antenna patterns of a plurality of antenna elements in a test antenna array in the middle field of the test antenna array, the test antenna array being a same type of antenna array as the antenna array;

calculating the far field antenna patterns from different positions in the far field of the test antenna array based on the measured far field antenna patterns of the plurality of antenna elements; and determining a difference between each of the calculated far field antenna patterns of the test antenna array and a composite antenna pattern, determined from the measured far field antenna patterns of the plurality of antenna elements, and populating the correction table with the determined differences.

13. The method of claim 7, wherein the correction table is populated by:
simulating far field antenna patterns of the plurality of antenna elements in the antenna array in the middle field of the antenna array using software simulation;

calculating the far field antenna patterns from different positions in the far field of the antenna array based on the simulated far field antenna patterns of the plurality of antenna elements; and determining a difference between each of the calculated far field antenna patterns and a composite antenna pattern, determined from the simulated far field antenna patterns of the plurality of antenna elements, and populating the correction table with the determined differences.

14. The method of claim 7, wherein the correction table is populated by:
approximating far field antenna patterns of the plurality of antenna elements in the antenna array in the middle field of the antenna array by assuming the far field antenna patterns for all the antenna elements are the same;

calculating the far field antenna patterns from different positions in the far field of the antenna array based on the approximated far field antenna patterns of the plurality of antenna elements; and determining a difference between each of the calculated far field antenna patterns and a composite antenna pattern, determined from the approximated far field antenna patterns of the plurality of antenna elements, and populating the correction table with the determined differences.

15. The method of claim 7, wherein the correction table is populated by:
   approximating far field antenna patterns of a plurality of antenna elements in a test antenna array in the middle field of the test antenna array by assuming the far field antenna patterns for all the antenna elements are the same;
   calculating the far field antenna patterns of the test antenna array from different positions in the far field of the test antenna array based on the approximated far field antenna patterns of the plurality of antenna elements; and
   determining a difference between each of the calculated far field antenna patterns and a composite antenna pattern, determined from the approximated far field antenna patterns of the plurality of antenna elements, and populating the correction table with the determined differences.

16. The test system of claim 8, further comprising:
   a user interface including a display for displaying the antenna pattern in the first position and the second position.

17. The test system of claim 16, wherein the user interface further includes a user input device configured to receive coordinates of at least the second position in the far field of the antenna array for which determination of the antenna pattern is desired.

18. The test system of claim 8, wherein the predetermined correction data is determined by:
   measuring far field antenna patterns of the plurality of antenna elements in the antenna array in the middle field of the antenna array;
   calculating the far field antenna patterns from different positions in the far field of the antenna array based on the measured far field antenna patterns of the plurality of antenna elements; and
   determining a difference between each of the calculated far field antenna patterns and a composite antenna pattern, determined from the measured far field antenna patterns of the plurality of antenna elements, and populating the correction table with the determined differences.

19. The test system of claim 8, wherein the predetermined correction data is determined by:
   simulating far field antenna patterns of the plurality of antenna elements in the antenna array in the middle field of the antenna array using software simulation;
   calculating the far field antenna patterns from different positions in the far field of the antenna array based on the simulated far field antenna patterns of the plurality of antenna elements; and
   determining a difference between each of the calculated far field antenna patterns and a composite antenna pattern, determined from the simulated far field antenna patterns of the plurality of antenna elements, and populating the correction table with the determined differences.

20. The test system of claim 8, wherein the predetermined correction data is determined by:
   approximating far field antenna patterns of the plurality of antenna elements in the antenna array in the middle field of the antenna array by assuming the far field antenna patterns for all the antenna elements are the same;
   calculating the far field antenna patterns from different positions in the far field of the antenna array based on the approximated far field antenna patterns of the plurality of antenna elements; and
   determining a difference between each of the calculated far field antenna patterns and a composite antenna pattern, determined from the approximated far field antenna patterns of the plurality of antenna elements, and populating the correction table with the determined differences.

* * * * *